(12) United States Patent
Bang et al.

(10) Patent No.: US 8,652,911 B2
(45) Date of Patent: Feb. 18, 2014

(54) SEMICONDUCTOR DEVICE AND METHOD OF MANUFACTURING THE SAME

(75) Inventors: Kee-In Bang, Chungbuk (KR);
Tae-Jung Lee, Yongin-si (KR);
Myoung-Kyu Park, Yongin-si (KR)

(73) Assignee: Samsung Electronics Co., Ltd.,
Suwon-Si, Gyeonggi-Do (KR)

( * ) Notice: Subject to any disclaimer, the term of this patent is extended or adjusted under 35 U.S.C. 154(b) by 242 days.

(21) Appl. No.: 13/175,332

(22) Filed: Jul. 1, 2011

(65) Prior Publication Data
US 2012/0003805 A1    Jan. 5, 2012

(30) Foreign Application Priority Data

Jul. 5, 2010    (KR) .................... 10-2010-0064353

(51) Int. Cl.
*H01L 21/336* (2006.01)
*H01L 21/762* (2006.01)
(52) U.S. Cl.
USPC ................... 438/296; 438/424; 257/E21.443; 257/E21.546

(58) Field of Classification Search
None
See application file for complete search history.

(56) References Cited

U.S. PATENT DOCUMENTS

| 8,405,084 B2 * | 3/2013 | Lee et al. ................... 257/59 |
| 2004/0212024 A1 * | 10/2004 | Oh et al. ................... 257/396 |

FOREIGN PATENT DOCUMENTS

| JP | 2001-156290 | 6/2001 |
| JP | 2008-028117 | 2/2008 |
| KR | 1020030058438 | 7/2003 |

* cited by examiner

*Primary Examiner* — Seahvosh Nikmanesh
(74) *Attorney, Agent, or Firm* — F. Chau & Associates, LLC

(57) ABSTRACT

A method of fabricating a semiconductor device includes forming a device isolation region on a semiconductor substrate to define an active region, forming a gate electrode on the active region and the device isolation region across the active region, and forming at least one gate electrode opening portion in the gate electrode so as to overlap an edge portion of the active region, wherein the gate electrode opening portion is simultaneously formed with the gate electrode.

14 Claims, 23 Drawing Sheets

US 8,652,911 B2

SEMICONDUCTOR DEVICE AND METHOD OF MANUFACTURING THE SAME

CROSS-REFERENCE TO RELATED APPLICATIONS

This application claims priority from Korean Patent Application No. 10-2010-0064353 filed on Jul. 5, 2010 in the Korean Intellectual Property Office, and all the benefits accruing therefrom under 35 U.S.C. 119, the contents of which in its entirety are herein incorporated by reference.

BACKGROUND

1. Technical Field

The present inventive concept relates to a method of fabricating a semiconductor device.

2. Discussion of the Related Art

In recent years, as information media such as computers enjoy widespread use, semiconductor devices continue to develop at a rapid pace. In general, semiconductor devices with rapid operation speeds and a large amount of memory are desired. To meet these requirements, semiconductor manufacturing technology must keep pace with continuously improving degrees of integration, reliability, response speed, etc., of semiconductor devices.

Various techniques for device isolation of semiconductor devices have been proposed such as a local oxidation of silicon (LOCOS) process. As the size of the semiconductor device is continuously decreasing, instead of the LOCOS process, a shallow trench isolation (STI) process has been used to form a device isolation film in order to reduce a size of the device isolation region.

A hump phenomenon occurs at a boundary portion between the STI region and an active region of the semiconductor device, lowering stability of the semiconductor device.

SUMMARY

The embodiments of present inventive concept provide a method of fabricating a semiconductor device, which can prevent a hump phenomenon from occurring at an interface between an STI region and an active region of the semiconductor device.

According to an aspect of the present inventive concept, there is provided a method of fabricating a semiconductor device, comprising forming a device isolation region on a semiconductor substrate to define an active region, forming a gate electrode on the active region and the device isolation region, the gate electrode extending from the isolation region across the active region, and forming at least one gate electrode opening portion in the gate electrode so as to overlap an edge portion of the active region, wherein the gate electrode opening portion is simultaneously formed with the gate electrode.

According to an aspect of the present inventive concept, a method of fabricating a semiconductor device comprises defining a device isolation region and an active region by performing a shallow trench isolation (STI) process on a semiconductor substrate, forming a gate insulation layer on the device isolation region and the active region, forming a gate electrode on the gate insulation layer, and forming at least one gate electrode opening portion in the gate electrode so as to overlap an edge portion of the active region, wherein the performing of the STI process comprises forming a trench surrounding the active region in the semiconductor substrate, and forming an insulation pattern in the trench, and the gate electrode opening portion is simultaneously formed with the gate electrode.

According to an aspect of the present inventive concept, a method of fabricating a semiconductor device comprises forming a device isolation region on a semiconductor substrate to define an active region, the device isolation region including a trench and an insulation pattern formed in the trench, forming a gate electrode on the active region and the device isolation region, and forming at least one channel formation preventing portion in the gate electrode so as to prevent a channel from being formed at an edge portion of the active region, wherein the channel formation preventing portion is formed to overlap the edge portion.

According to an aspect of the present inventive concept, a semiconductor device comprises an isolation region on a semiconductor substrate, an active region on the semiconductor substrate, a gate electrode on the active region and extending from the isolation region into the active region, and at least one opening portion in the gate electrode, the opening portion overlapping an edge portion of the active region.

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION

Figure 1:
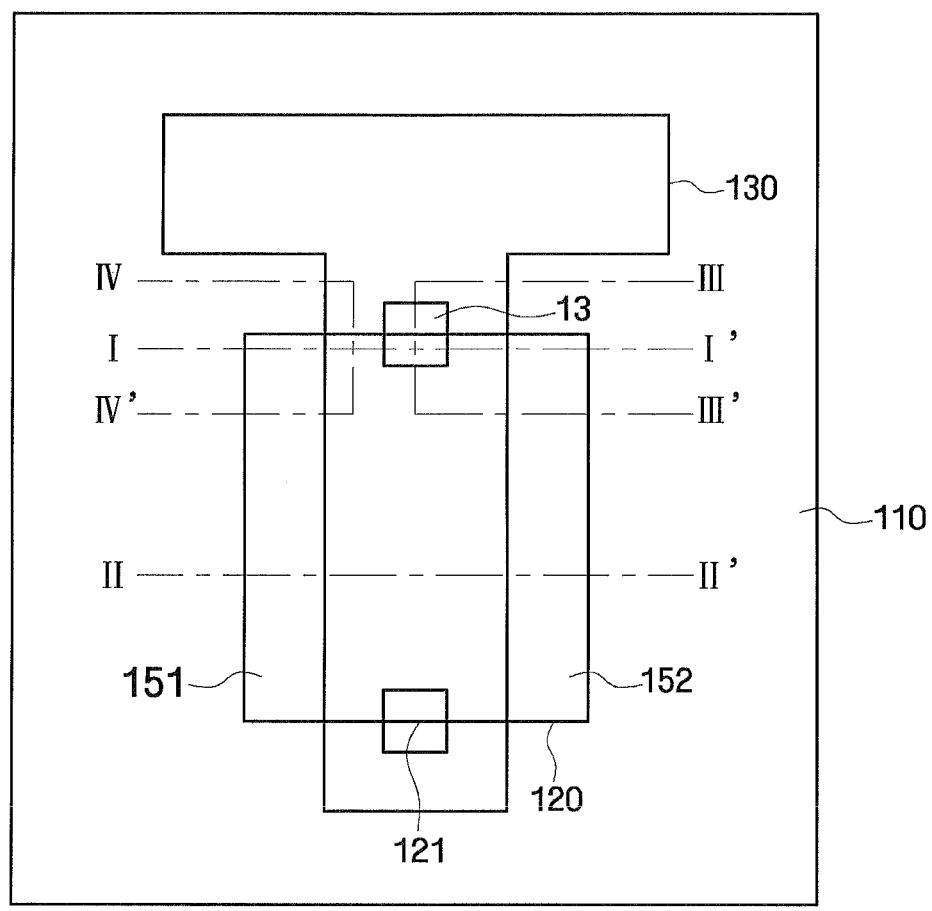
FIG. 1 is a plan view of a semiconductor device according to embodiments of the present inventive concept.

The embodiments of the present inventive concept may be understood more readily by reference to the following detailed description of embodiments and the accompanying drawings. The present inventive concept may, however, be embodied in many different forms and should not be construed as being limited to the embodiments set forth herein. In the drawings, the thickness of layers and regions may be exaggerated for clarity.

Like numbers may refer to like elements throughout. As used herein, the term "and/or" includes any and all combinations of one or more of the associated listed items.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terminology used herein is for the purpose of describing particular embodiments only and is not intended to be limiting of the inventive concept. As used herein, the singular forms are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Embodiments of the inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
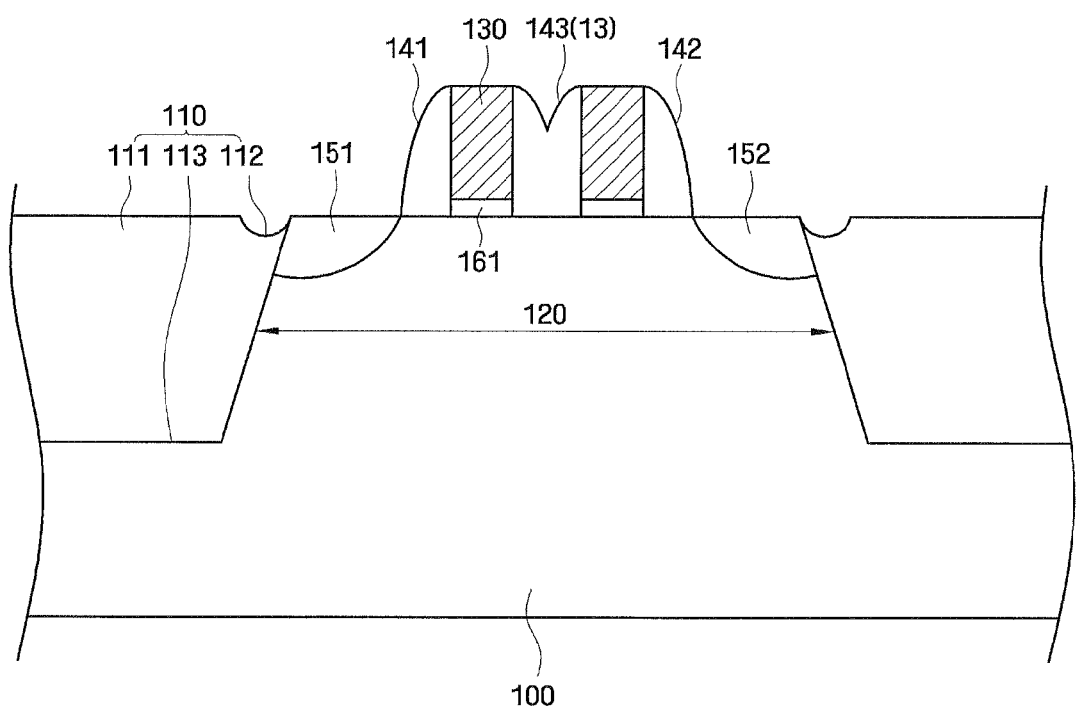
FIG. 2 is a cross-sectional view taken along the line I-I' of FIG. 1.
Figure 3:
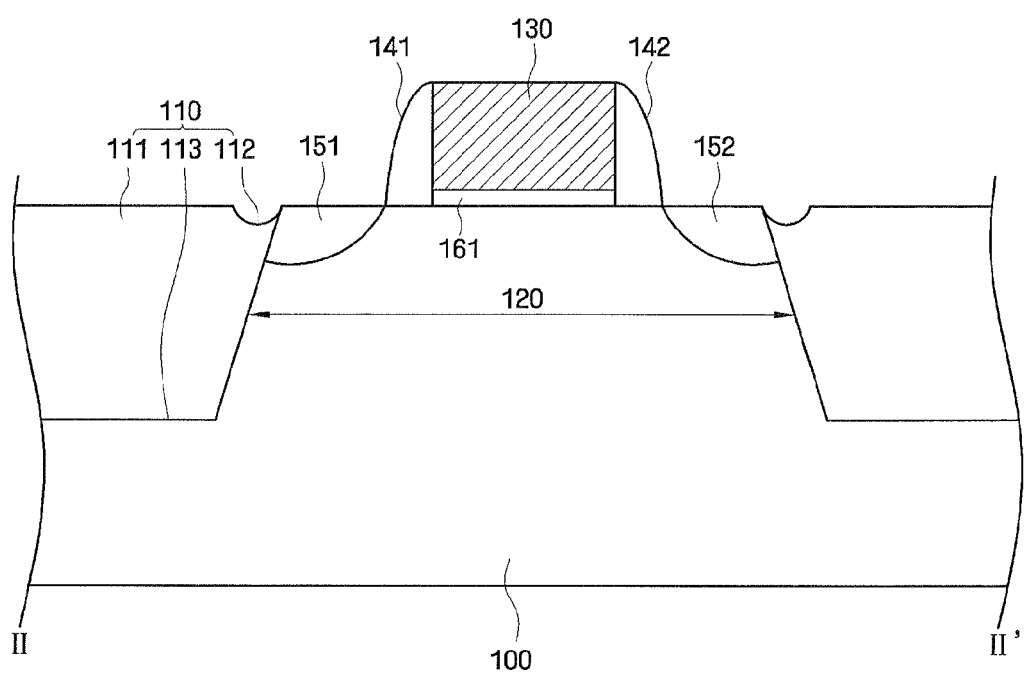
FIG. 3 is a cross-sectional view taken along the line II-II' of FIG. 1.
Figure 4:
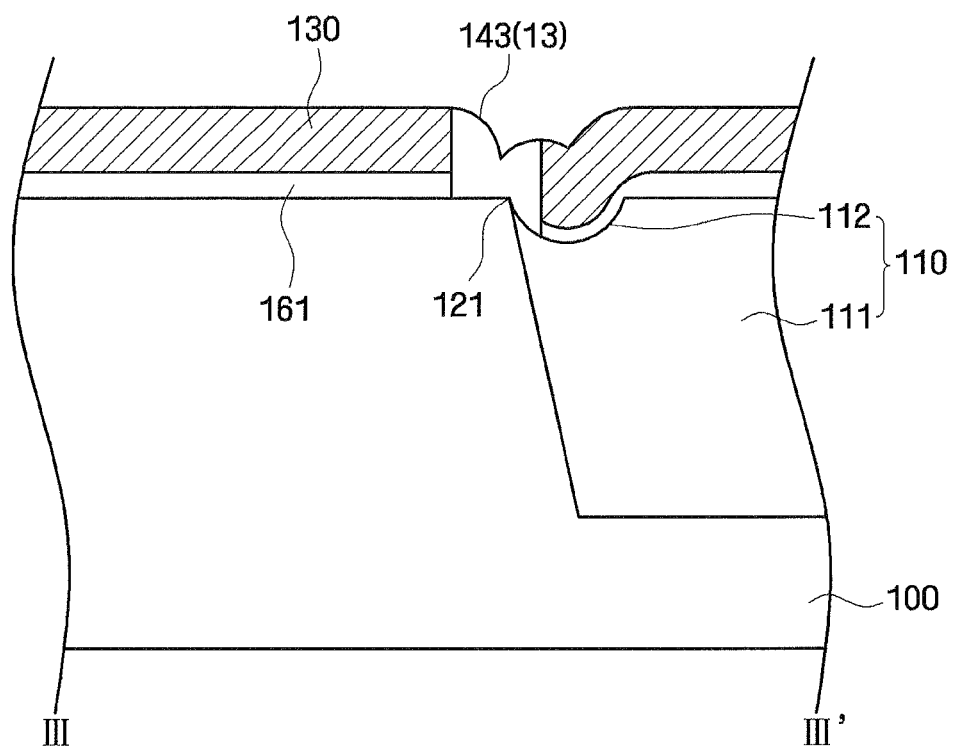
FIG. 4 is a cross-sectional view taken along the line III-III' of FIG. 1.
Figure 5:
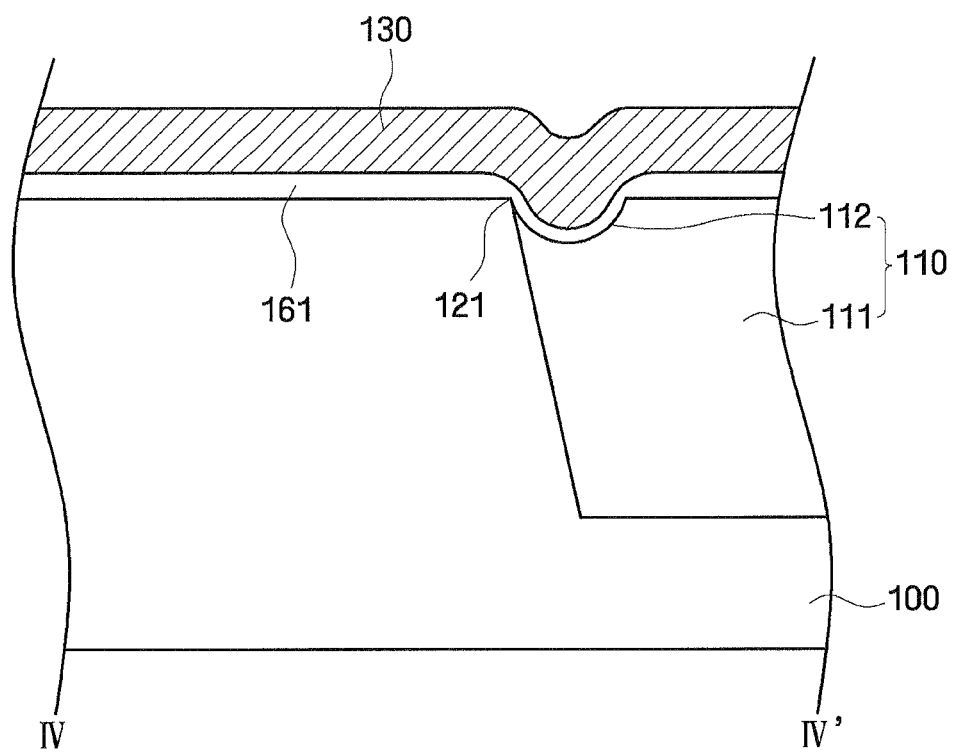
FIG. 5 is a cross-sectional view taken along the line IV-IV' of FIG. 1.

Hereinafter, semiconductor devices and methods of fabricating a semiconductor device according to embodiments of the present inventive concept will be described with reference to FIGS. 1 through 24. FIG. 1 is a plan view of a semiconductor device according to embodiments of the present inventive concept, FIG. 2 is a cross-sectional view taken along the line I-I' of FIG. 1, FIG. 3 is a cross-sectional view taken along the line II-II' of FIG. 1, FIG. 4 is a cross-sectional view taken along the line III-III' of FIG. 1, and FIG. 5 is a cross-sectional view taken along the line IV-IV' of FIG. 1.

Referring to FIGS. 1 to 5, the semiconductor device fabricated according to embodiments of the present inventive concept includes a semiconductor substrate 100, a device isolation region 110, an active region 120, a gate insulation layer 161, and a gate electrode 130.

The semiconductor substrate 100 may be, for example, a silicon substrate or a Silicon On Insulation (SOI) substrate. The device isolation region 110 includes a trench 113, and an insulation pattern 111 formed in the trench 113. According to an embodiment, the device isolation region 110 may be formed in a Shallow Trench Isolation (STI) structure having relatively good device isolating characteristics and occupying a reduced area, which can be useful for high integration.

According to an embodiment, the insulation pattern 111 includes a dent 112 recessed toward a lower portion of the trench 113. According to an embodiment, dent 112 is positioned near edge portions 121 of the active region 120. The dent 112 may prevent the edge portions 121 of the active region 120 from being covered by the insulation pattern 111.

The insulation pattern 111 includes an insulating material, for example, an oxide. In addition, the insulation pattern 111 may be stacked by, for example, ozone-TEOS (Tetra Ortho Silicate Glass), APCVD (Atmospheric Pressure Chemical Vapor Deposition), PECVD (Plasma Enhanced Chemical Vapor Deposition), or HDP CVD (High Density Plasma Chemical Vapor Deposition).

According to an embodiment, in order to improve device-device insulation capability, the insulation pattern 111 may include a trench insulation layer (not shown) and a trench liner (not shown). The trench insulation layer and the trench liner may be conformally formed on an inner wall of the trench 113. The trench insulation layer facilitates adhering of the insulation pattern 111 filling the trench 113 to the inner wall of the trench 113. In addition, the trench insulation layer compensates for damage done to a silicon lattice on the inner wall of the trench 113 due to etching, by preventing leakage current of the insulation pattern 111 filling the trench 113 from increasing. The trench insulation layer may be formed of an oxide layer, for example, a silicon oxide layer ($SiO_2$).

The trench liner prevents the insulation pattern 111 and the trench insulation layer from being over-etched when the insulation pattern 111 is formed in the trench 113. Accordingly, the device isolation region 110 having an improved device isolating characteristics can be formed.

The device isolation region 110 having an STI structure surrounds the active region 120. Thus, the edge portions of the active region 120 face the device isolation region 110.

Referring to FIG. 1, the gate electrode 130 is formed on the device isolation region 110 and the active region 120. One end of the gate electrode 130 is positioned on one side of the device isolation region 110 and another end of the gate electrode 130 is positioned on another side of the device isolation region 110, facing and opposite to the one side of the device isolation region 110. The gate electrode 130 extends across the active region 120 and overlaps the active region 120. The gate electrode 130 may include, for example, poly-Si, poly-SiGe, a metal such as Ta, TaN, TaSiN, TiN, Mo, Ru, Ni, or NiSi, or combinations thereof.

Since a portion of the gate electrode 130 is also formed on the device isolation region 110 and extends from the isolation region 110 to the active region 120, part of the gate electrode 130 is positioned on a boundary portion of the active region 120 and the device isolation region 110. According to an embodiment, the gate electrode 130 is positioned on the dent 112 of the insulation pattern 111. Since the gate electrode 130 overlaps the edge portions 121 of the active region 120, a corner transistor may be formed at the edge portions 121 of the active region 120. According to an embodiment, the gate electrode 130 overlaps edge portions on two sides of the active region 120, and two corner transistors are formed on one active region 120, so that a channel may be formed between edge portions 121 from one side of the active region 120 to another side of the active region 120. In addition, according to an embodiment, the center of the active region 120 and the gate electrode 130 overlap with each other, forming a flat transistor. Accordingly, for example, two corner transistors and one flat transistor may be formed in one active region 120.

The gate insulation layer 161 is formed on the active region 120 overlapping the gate electrode 130 and the device isolation region 110. The gate insulation layer 161 is formed between the gate electrode and the active region 120 and insulates the active region 120 and the gate electrode 130 from each other. The gate insulation layer 161 may include, for example, a thermal oxide layer or a silicon oxide layer ($SiO_x$) made of, for example, FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced Tetra Ethyl Ortho Silicate), FSG (Fluoride Silicate Glass), or HDP (high density plasma).

In order to prevent a channel from being formed at the edge portions 121 of the active region 120 by corner transistors formed when the gate electrode 130 and the edge portions 121 of the active region 120 overlap each other, the gate electrode 130, according to an embodiment, includes a channel formation preventing portion 13. The channel formation preventing portion 13 is formed in an area of the gate electrode 130 overlapping the edge portions 121 of the active region 120. Since the channel formation preventing portion 13 prevents a channel from being formed at the edge portions 121 of the active region 120, a hump phenomenon, in which a transistor appears to have two threshold voltages, can be prevented.

According to an embodiment, the channel formation preventing portion 13 includes a gate electrode opening portion (132 of FIG. 16) and a spacer pattern 143 (see, e.g., FIGS. 2 and 4). The channel formation preventing portion 13 prevents the edge portions 121 of the active region 120 and the gate electrode 130 from overlapping each other, thereby preventing a channel from being formed at the edge portions 121 of the active region 120.

Spacers 141 and 142 are formed at opposite sides of the gate electrode 130. The spacers 141 and 142 may include, for example, a nitride layer or an oxide layer. According to an embodiment, the spacer pattern 143 of the spacers 141 and 142 may be made of the same material as the spacers 141 and 142.

According to an embodiment, source and drain regions 151 and 152 doped with, for example, an impurity of a Group III element or a Group V element of the Periodic Table of Elements, are formed in a portion of the active region 120 that does not overlap with the gate electrode 130, the spacers 141 and 142, and the channel formation preventing portion 13. According to an embodiment, the source and drain regions 151 and 152 are formed at opposite sides of the gate electrode 130 in parallel with a direction in which the gate electrode 130 extends.

A manufacturing method of a semiconductor device according to an embodiment of the present inventive concept will be described with reference to FIGS. 6 through 22.

Figure 6:
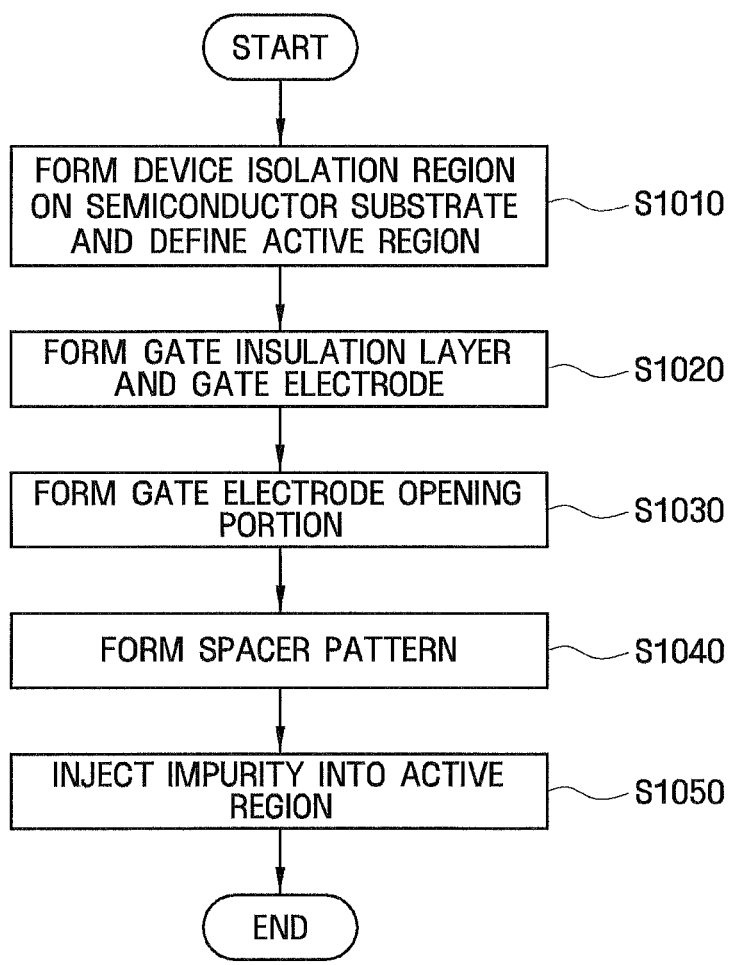
FIG. 6 is a flowchart showing the sequential order of a method of fabricating a semiconductor device according to an embodiment of the present inventive concept.

FIG. 6 is a flowchart showing a method of fabricating a semiconductor device according to an embodiment of the present inventive concept, and FIGS. 7 through 22 show various steps of the method of fabricating a semiconductor device according to an embodiment of the present inventive concept. For the sake of convenient explanation, in the drawings, the same reference numerals are used to designate the same or similar components and redundant description are omitted.

Referring to FIGS. 6 through 9, a device isolation region 110 is formed on a semiconductor substrate 100 to define an active region 120 (S1010).

Figure 7:
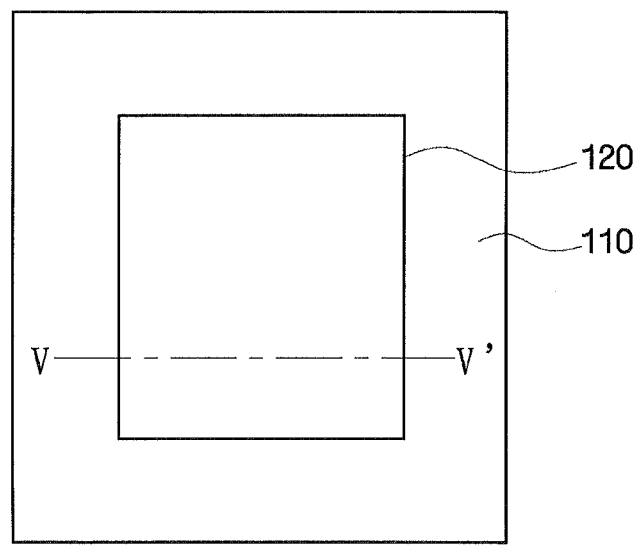
FIGS. 7 through 22 show various steps of the method of fabricating a semiconductor device according to an embodiment of the present inventive concept.
Figure 8:
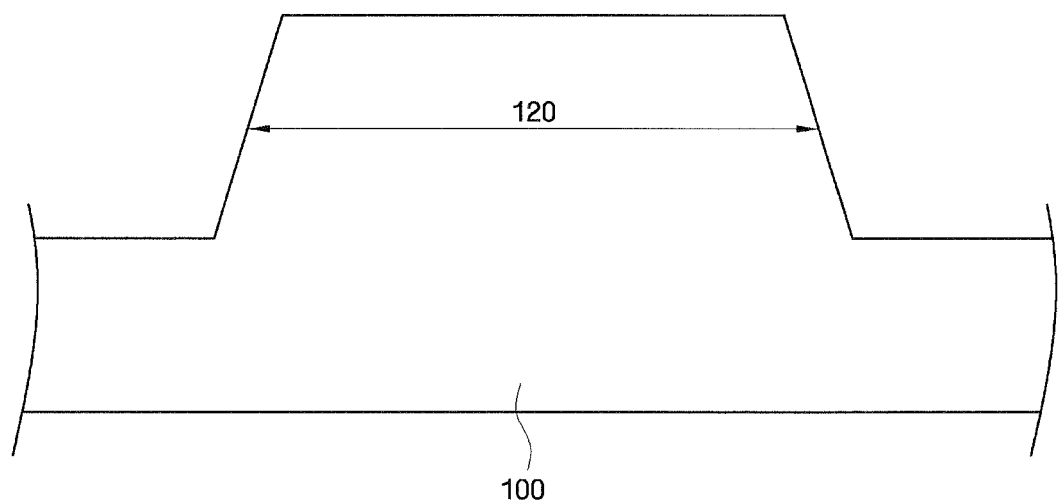
Figure 9:
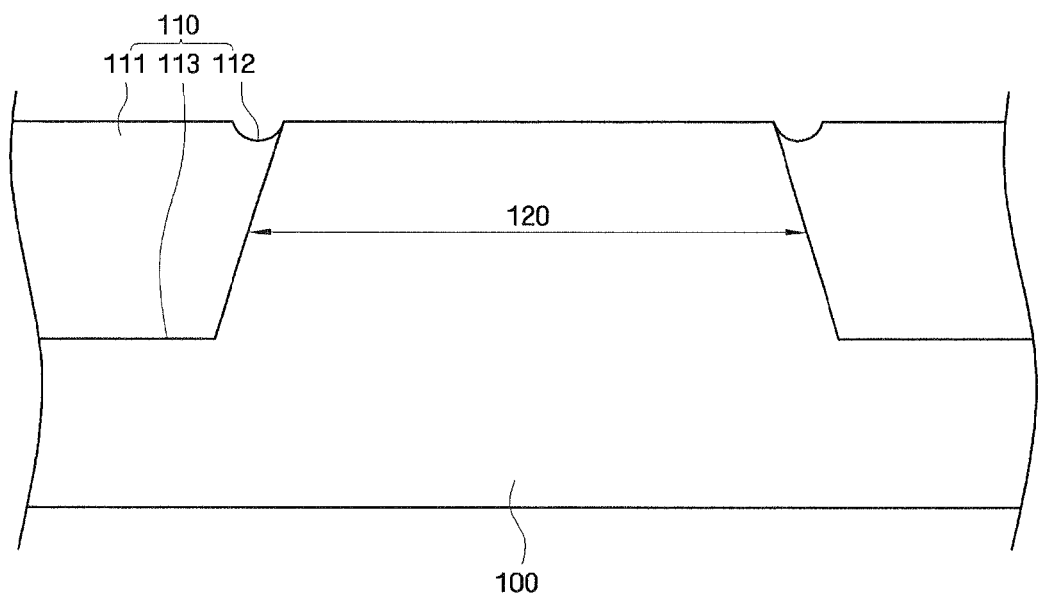

Referring to FIGS. 7-9, a buffer oxide layer (not shown) and a silicon nitride layer (not shown) as a hard mask layer are sequentially formed on the semiconductor substrate 100, and the semiconductor substrate 100, the buffer oxide layer and the hard mask layer are etched to form a trench 113. Thereafter, an insulation layer (not shown) is formed on the entire surface of the semiconductor substrate 100 having the trench 113, thereby filling the trench 113 with an insulating material. The insulation layer may be formed of, for example, silicon oxide, and deposited by chemical vapor deposition (CVD). Thereafter, the insulating material in the area of the trench 113 is planarized using chemical mechanical planarization (CMP), thereby forming an insulation pattern 111 in the trench 113. According to an embodiment, a portion of the insulation pattern 111 adjacent to the active region 120 is excessively removed, thereby forming a dent 112 recessed toward a lower portion of the trench 113. The dent 112 prevents the edge portions 121 of the active region 120 from being covered by the insulating material of the insulation pattern 111.

According to an embodiment, before filling the trench 113 with the insulating material, in order to improve an insulating capability of the device isolation region 110, a trench insulation layer (not shown) and a trench liner (not shown) may be conformally formed on an inner wall of the trench 113.

As described above, the device isolation region 110 is formed in a Shallow trench Isolation (STI) structure surrounding the active region 120.

Figure 10:
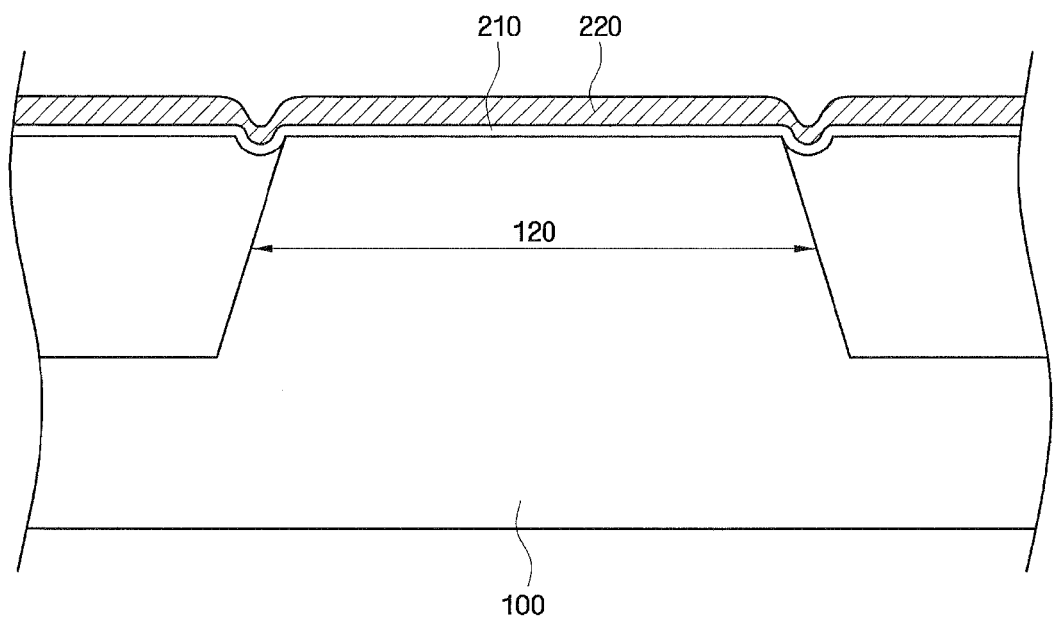
Figure 11:
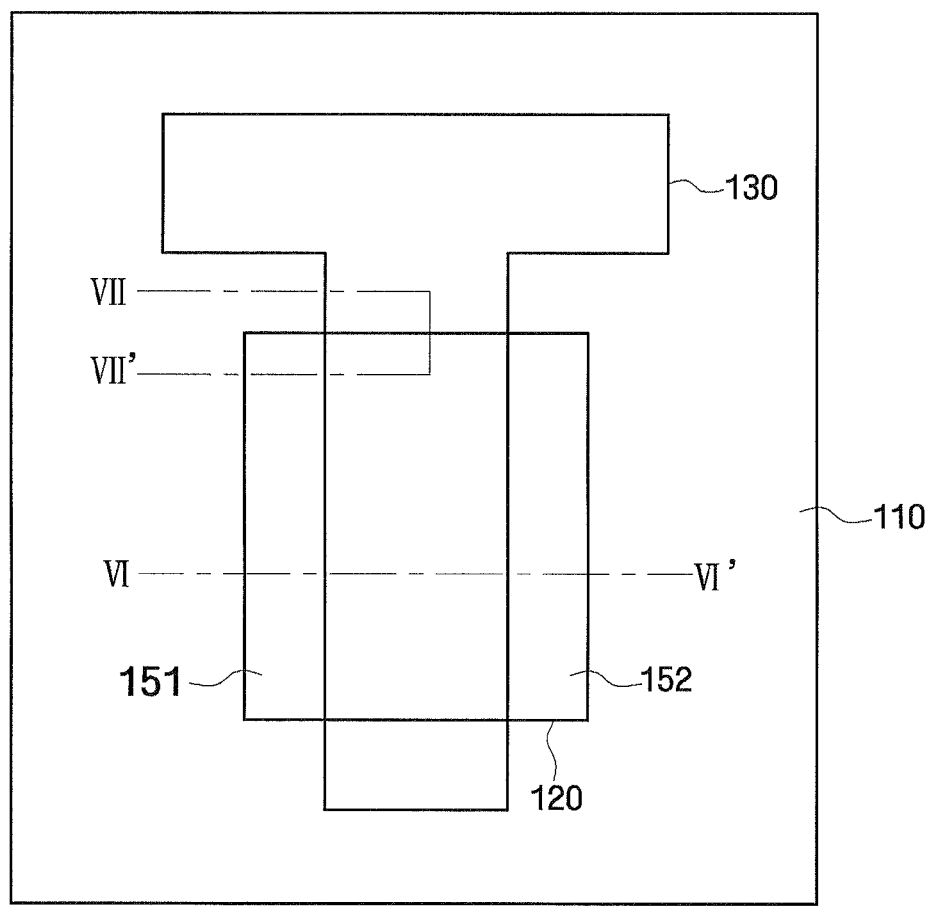
Figure 12:
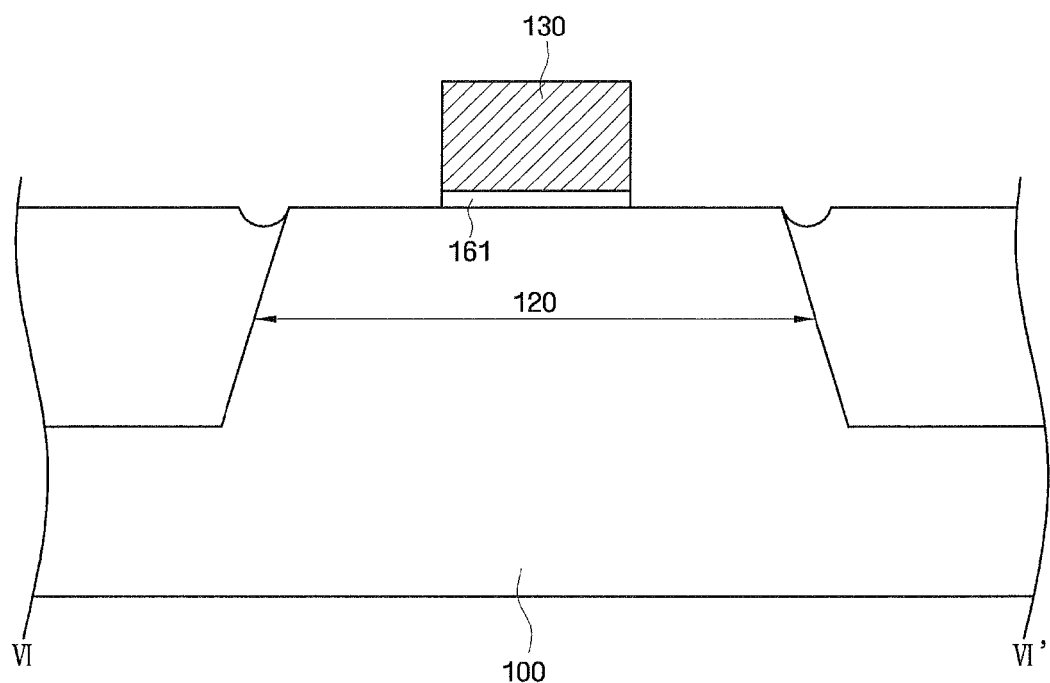
Figure 13:
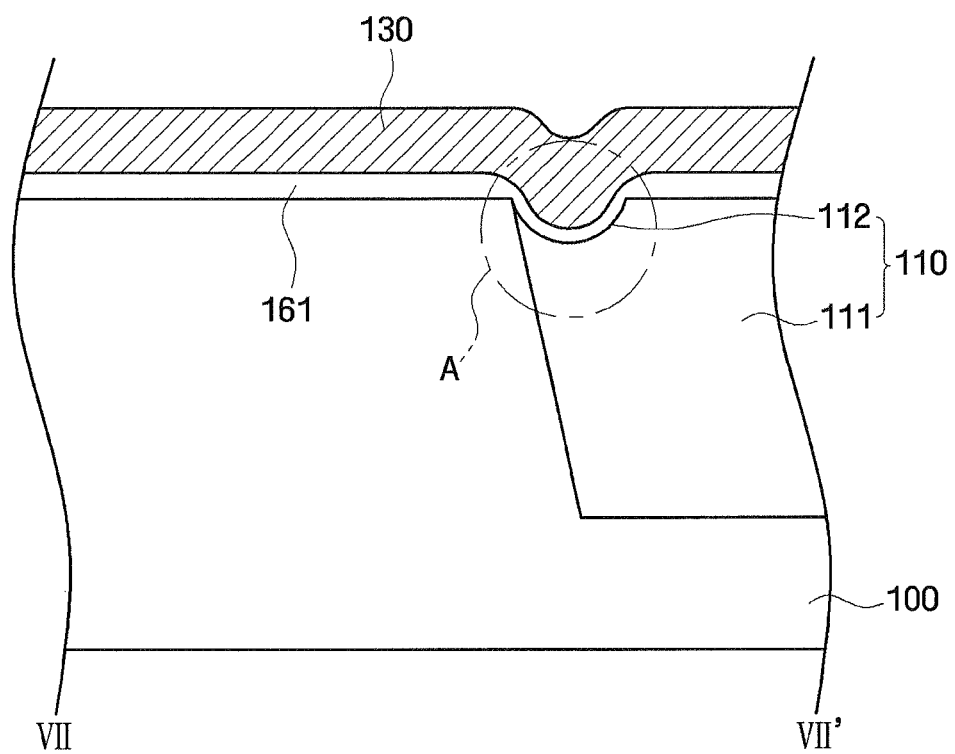

Referring to FIG. 10, a gate insulation layer forming insulation layer 210 and a gate electrode forming conductive layer 220 are sequentially stacked on the resultant product of FIG. 9. The gate insulation layer forming insulation layer 210 may be formed of, for example, a silicon oxide layer, and deposited by chemical vapor deposition (CVD). The gate electrode forming conductive layer 220 may be formed of, for example, a titanium nitride (TiN) layer and deposited by sputtering. Alternatively, the gate electrode forming conductive layer 220 may be formed of a titanium nitride (TiN) layer and deposited by physical vapor deposition (PVD), chemical vapor deposition (CVD), atomic layer deposition (ALD), or the like.

Referring to FIGS. 11 through 14, gate insulation layer forming insulation layer 210 and the gate electrode forming conductive layer 220 are patterned to form a gate insulation layer 161 and a gate electrode 130 (S1020). The gate insulation layer forming insulation layer 210 and the gate electrode forming conductive layer 220 may be patterned by, for example, photolithographic etching using a photoresist.

According to an embodiment, the gate insulation layer forming insulation layer 210 and the gate electrode forming conductive layer 220 are simultaneously patterned. In other words, the gate electrode 130 and the gate insulation layer 161 may be simultaneously formed.

Since the gate electrode 130 is disposed across the active region 120 and extends from one side of the device isolation region 110 to another side, that is, an opposite side of the device isolation region 110, the gate insulation layer 161 simultaneously formed with the gate electrode 130 is also formed to extend from the one side to the other side of the device isolation region 110.

Figure 14:
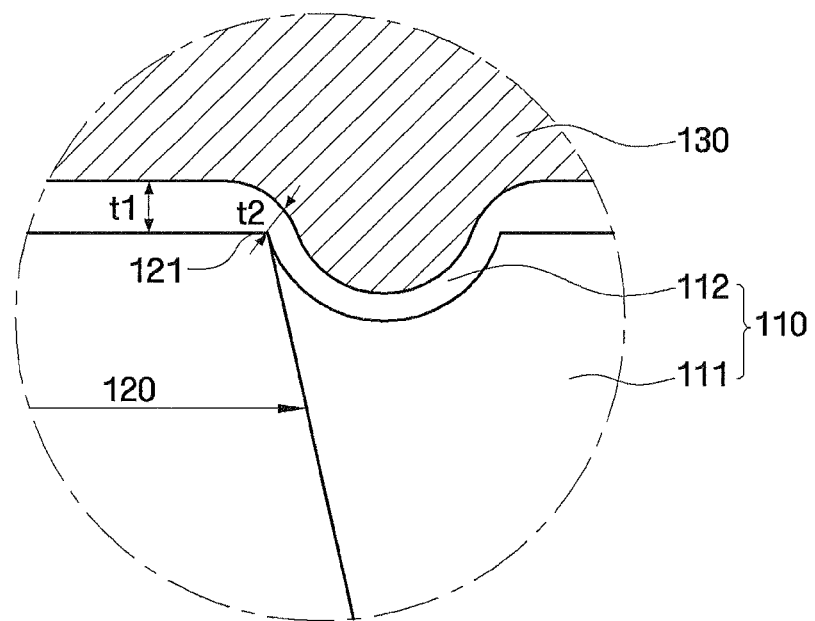
Figure 15:
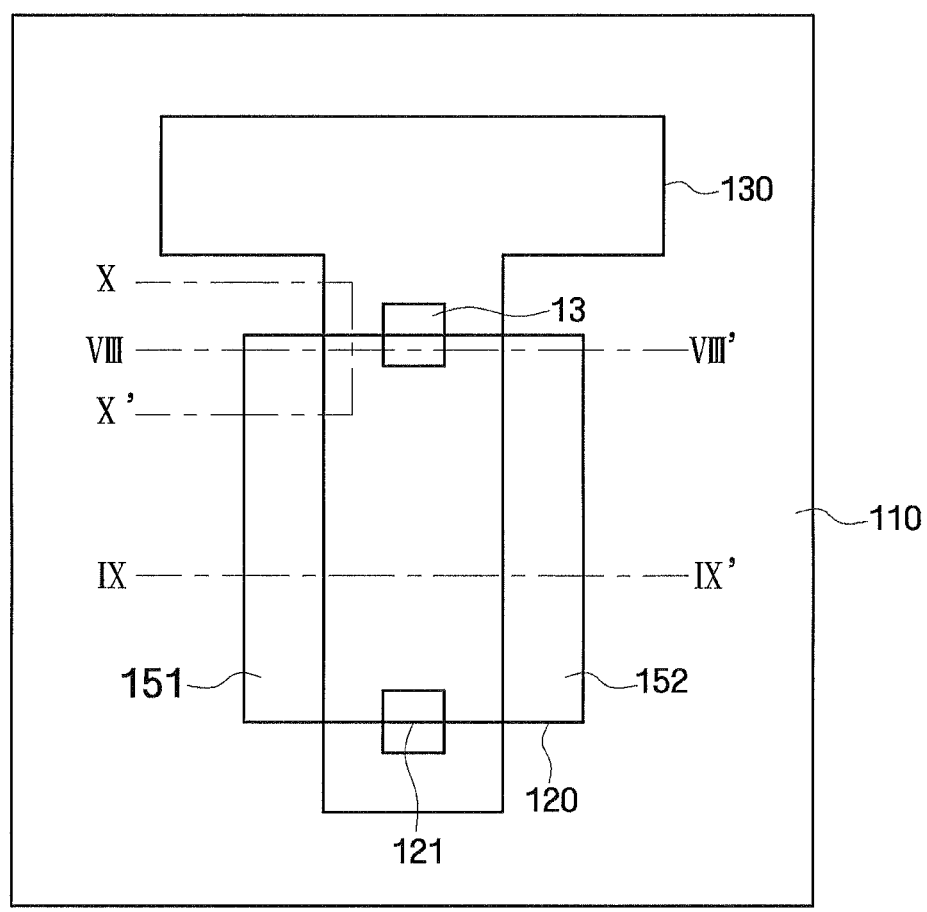

Referring to FIG. 14, according to an embodiment, the gate insulation layer 161 has a first thickness t1 at the center of the active region 120, and other portions of the active region 120 not at the edge portions 121 of the active region 120, and a second thickness t2 at the edge portions 121 of the active region 120. In other words, the gate insulation layer 161 has a different thickness at the edge portion of the active region 120, which corresponds to a boundary portion of the device isolation region 110 and the active region 120, than at those portions of the active region 120 not at the edge portions 121. For example, an edge thinning phenomenon may occur to the edge portions of the active region 120, so that the thickness t2 of the gate insulation layer 161 at the edge portions 121 of the active region 120 is smaller than the thickness t1 of the gate insulation layer 161 at the remaining portions of the active region 120.

Referring to FIGS. 15 through 18, according to an embodiment, a gate electrode opening portion 132 is formed in the gate electrode 130 (S1030). According to an embodiment, at least one gate electrode opening portion 132 is formed in the gate electrode 130. In addition, according to an embodiment, the gate electrode opening portion 132 overlaps the edge portions 121 of the active region 120. A transistor is formed in the active region 120 during a subsequent process. As a result, even if a threshold voltage is applied to the gate electrode 130, the gate electrode opening portion 132 prevents the threshold voltage from being applied to the edge portions 121 of the active region 120, and a channel is not formed at the edge portions 121 of the active region 120. In other words, the gate electrode opening portion 132 functions as a channel formation preventing portion 13 that prevents a channel from being formed at the edge portions 121 of the active region 120.

According to an embodiment, the gate electrode opening portion 132 and the gate electrode 130 are formed at the same time. The gate electrode opening portion 132 is formed using the same mask at the same time when the gate electrode 130 is formed by patterning the gate electrode forming conductive layer 220. The gate insulation layer forming insulation layer 210 is patterned using the mask to form the gate electrode 130 and the gate electrode opening portion 132 and, according to an embodiment, a portion of the gate insulation layer 161 overlapping the gate electrode opening portion 132 is removed. Thus, a portion of the active region 120 overlapping the gate electrode opening portion 132, the edge portion 121 of the active region 120, and a portion of the device isolation region 110 is exposed through the gate electrode opening portion 132.

As described above, the gate electrode 130, the gate insulation layer 161 and the gate electrode opening portion 132 are formed using a single mask. Therefore, it is not necessary to provide an additional mask for forming the gate electrode opening portion 132.

Figure 16:
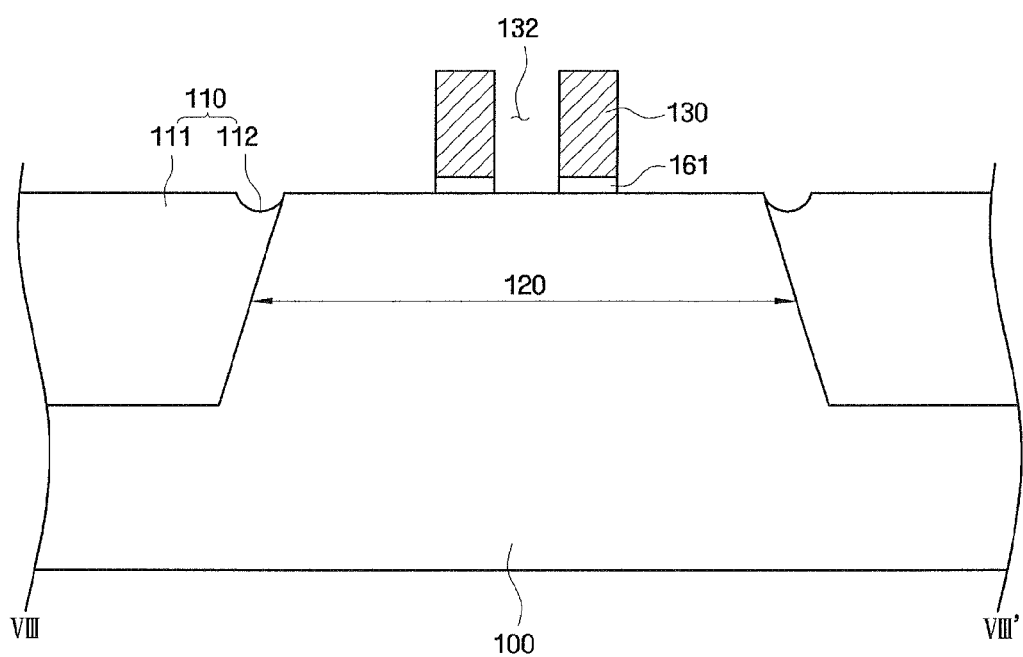
Figure 17:
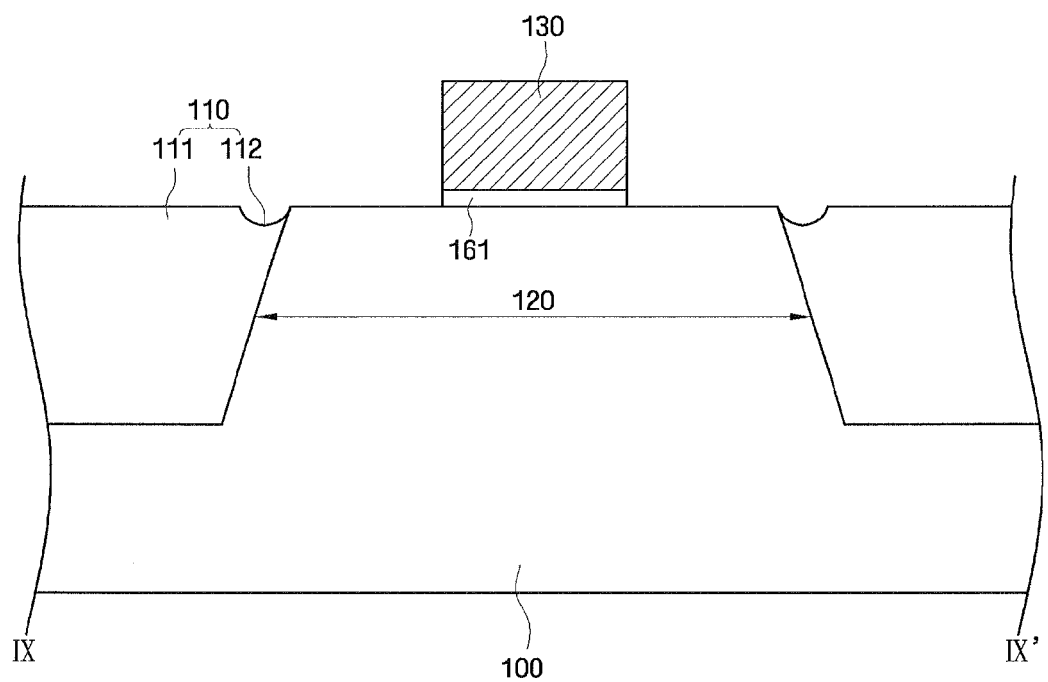
Figure 18:
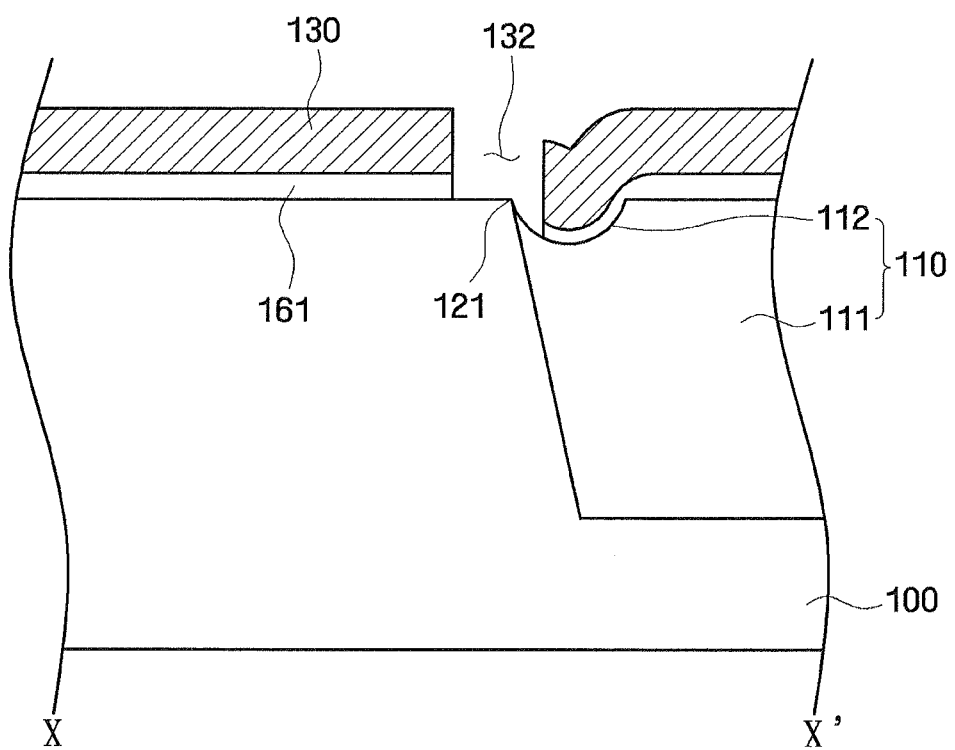
Figure 19:
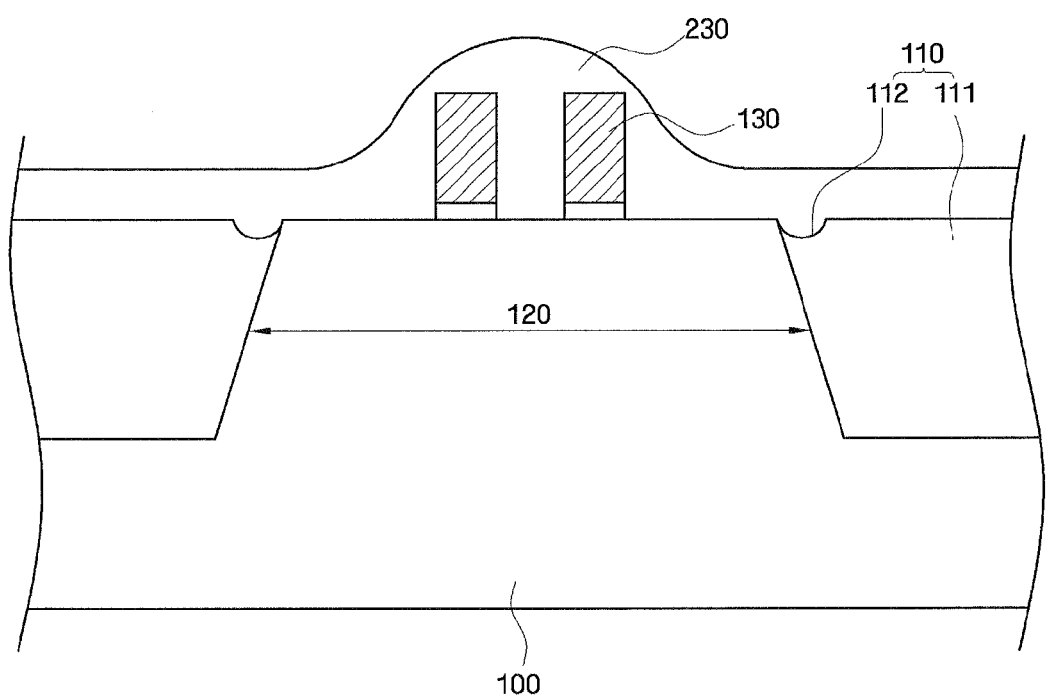

Referring to FIG. 19, a spacer forming material layer 230 is formed on the resultant product of FIGS. 16 through 18. The spacer forming material layer 230 may be formed of, for example, silicon oxide, and deposited by chemical vapor deposition (CVD). According to an embodiment, the gate electrode opening portion 132 is also filled with silicon nitride.

Figure 20:
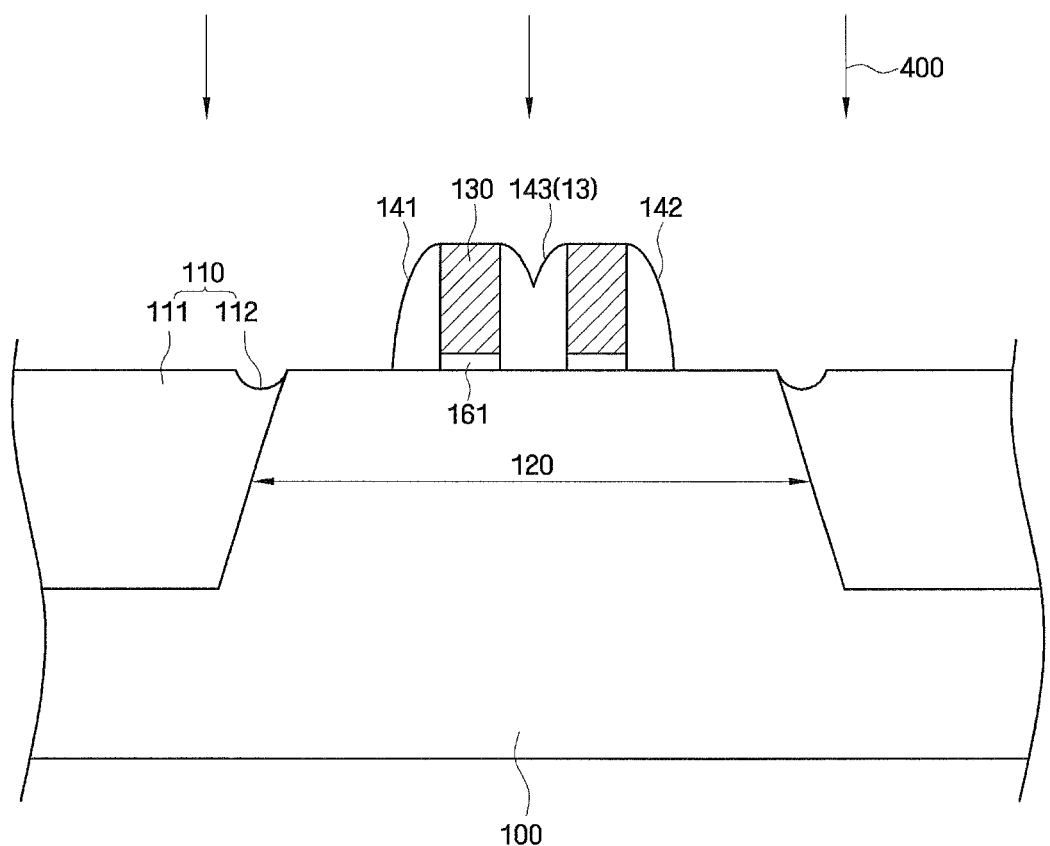
Figure 21:
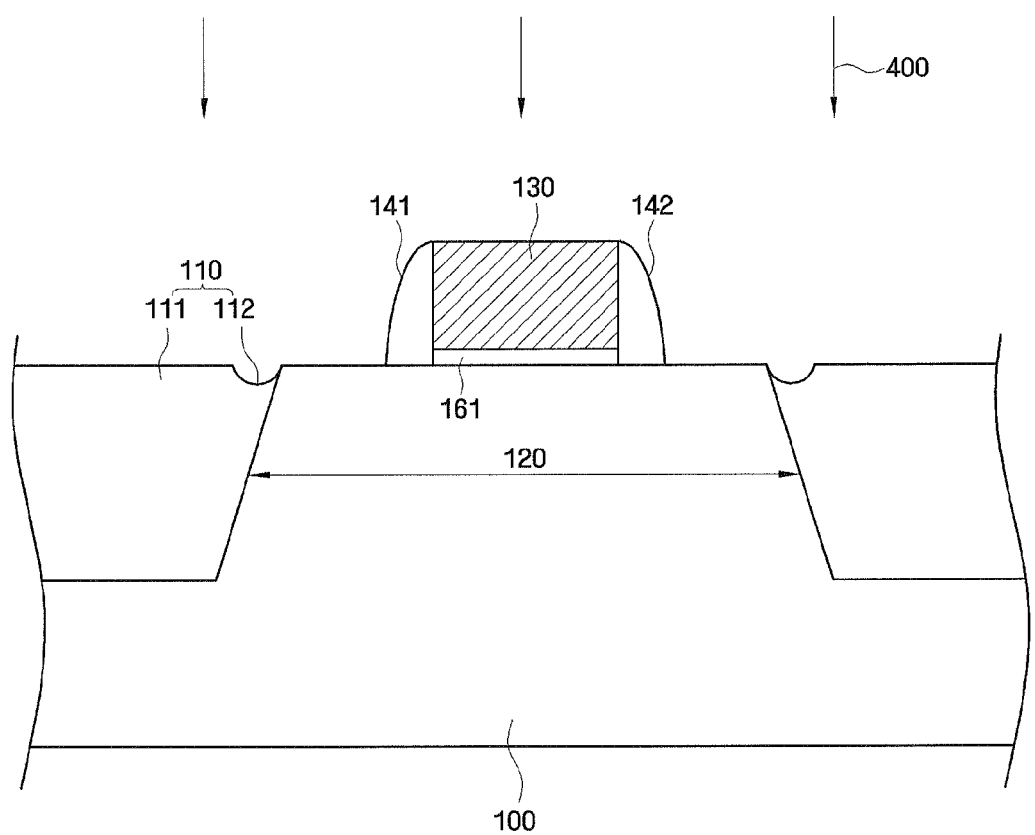
Figure 22:
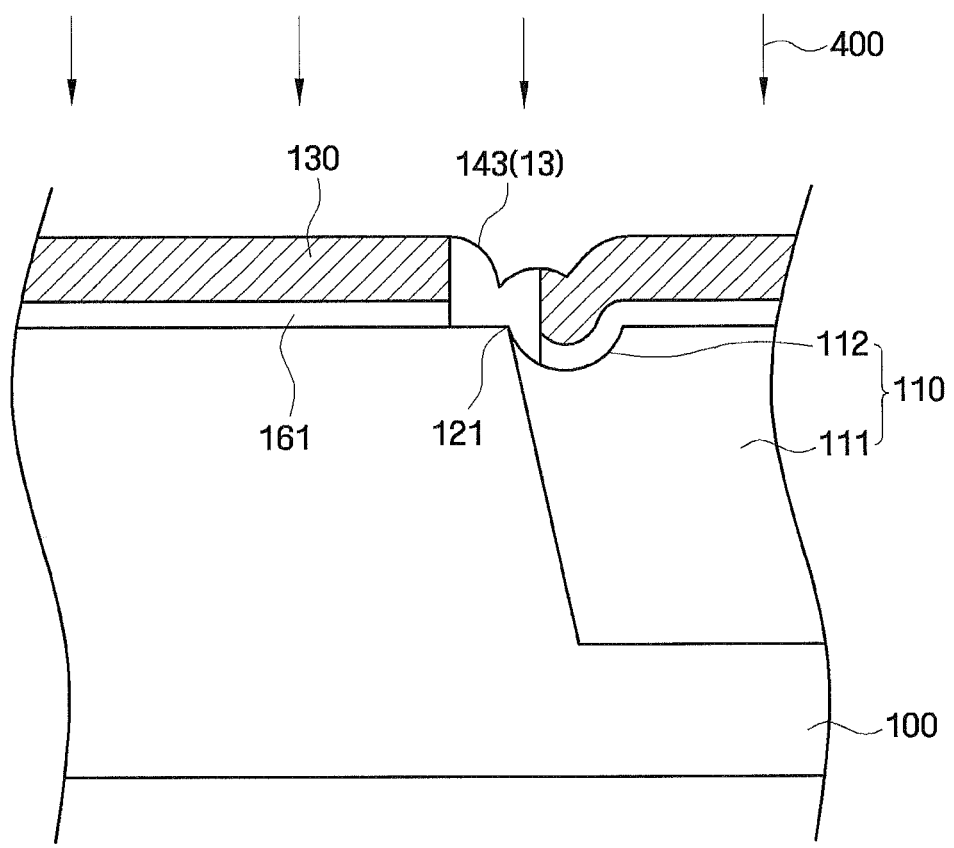

Referring to FIGS. 20 through 22, the spacer forming material layer 230 is etched back to form spacers 141 and 142 at opposite sides of the gate electrode 130. In addition, a spacer pattern 143 filling the gate electrode opening portion 132 is formed (S1040). Accordingly, a channel formation preventing portion 13 including the gate electrode opening portion 132 and the spacer pattern 143 is formed.

Next, an impurity of the Group III or V elements of the Periodic Table is injected into the active region 120 to form source and drain regions (S1050). According to an embodiment, the impurity may be injected into the portion of the active region 120 that is not overlapped with the gate electrode 130, the spacers 141 and 142 and the channel formation preventing portion 13. In other words, the impurity is not injected into the active region 120 that is overlapped with the gate electrode 130, the spacers 141 and 142 and the spacer pattern 143 of the channel formation preventing portion 13. Accordingly, the source and drain regions 151 and 152 are formed at opposite sides of the gate electrode 130 in parallel with a direction in which the gate electrode 130 extends.

As described above, a thickness of the gate insulation layer 161 is reduced at the edge portions 121 of the active region 120. For example, when an edge thinning, in which the thickness of the gate insulation layer 161 is reduced at the edge portions 121 of the active region 120, occurs to the edge portion 121 of the active region 120, an electric field is concentrated on a thinned portion of the gate insulation layer 161, and the gate insulation layer 161 may deteriorate. Further, when a transistor is driven, a channel at the edge portion 121 of the active region 120, i.e., a channel of a corner transistor, is first formed and turned on, and a channel at the center of the active region 120, i.e., a channel of a flat transistor, is then formed and turned on. That is to say, a hump phenomenon in which a transistor appears to have two threshold voltages may occur. For example, the threshold voltage is lowered at the edge portion 121 of the active region 120, that is, a boundary portion of the active region 120 and the device isolation region 110, thereby lowering stability of the transistor.

However, in the semiconductor device according to the embodiments of the present inventive concept, since the channel formation preventing portion 13 is formed at a portion of the gate electrode 130 overlapping the edge portion 121 of the active region 120, it is possible to prevent a channel from being formed at the edge portion 121 of the active region 120, thereby preventing the hump phenomenon in which a transistor appears to have two threshold voltages.

Figure 23:
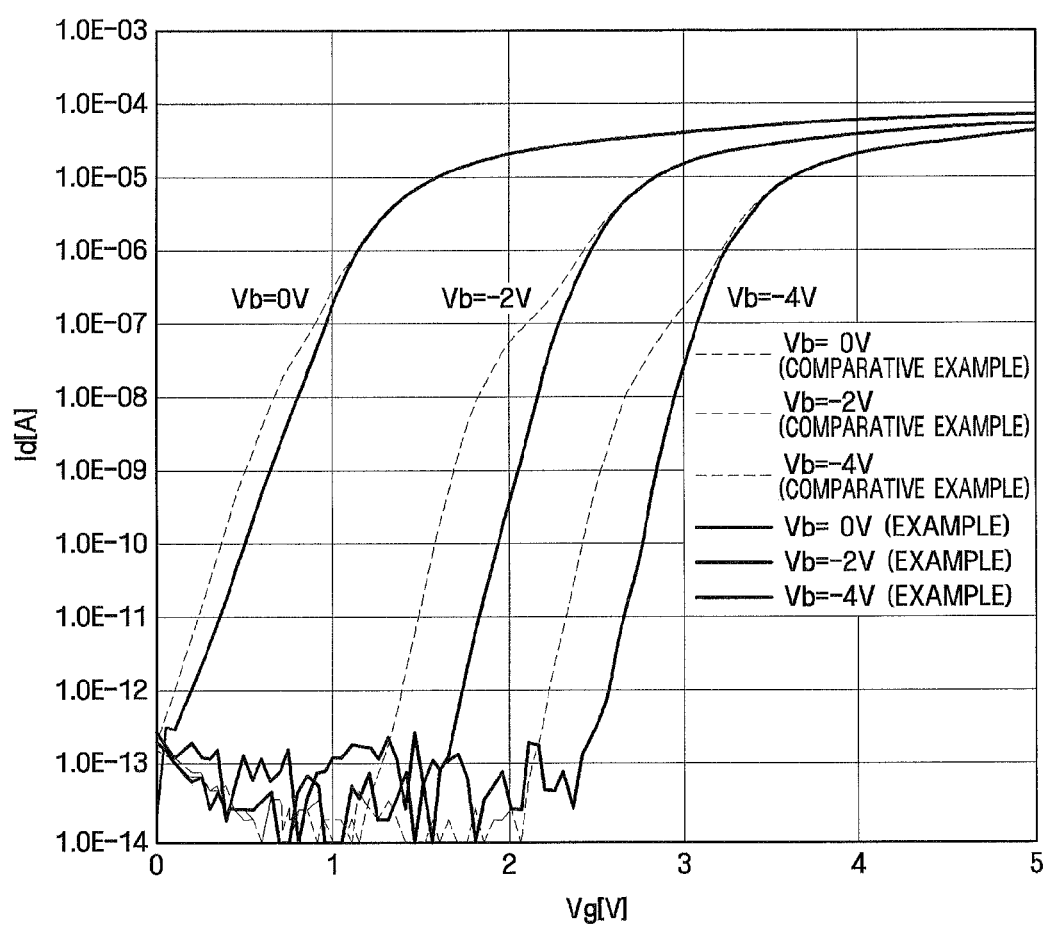
FIG. 23 is a graph for comparing electrical characteristics of a transistor of a semiconductor device according to an example embodiment of the present inventive concept and a transistor of a semiconductor device according to a comparative example.

FIG. 23 is a graph for comparing electrical characteristics of a transistor of a semiconductor device according to an embodiment of the present inventive concept (labeled Example) and a transistor of a comparative semiconductor device (labeled Comparative Example). The channel formation preventing portion is not included in the transistor of a semiconductor device used for the comparative examples.

Referring to FIG. 23, assuming that a gate-on current Id is 1.0E-09, a gate-on voltage Vg of the transistor of a semiconductor device according to an embodiment of the present inventive concept is moved to the right, compared to a gate-on voltage Vg of the transistor of a semiconductor device according to the comparative examples. In other words, a threshold voltage of the transistor of the semiconductor device according to an embodiment of the present inventive concept is not reduced while a threshold voltage of the transistor of the semiconductor device according to the comparative examples is reduced. Accordingly, the transistor of the semiconductor device according to an embodiment of the present inventive concept can prevent occurrence of a hump phenomenon.

Figure 24:
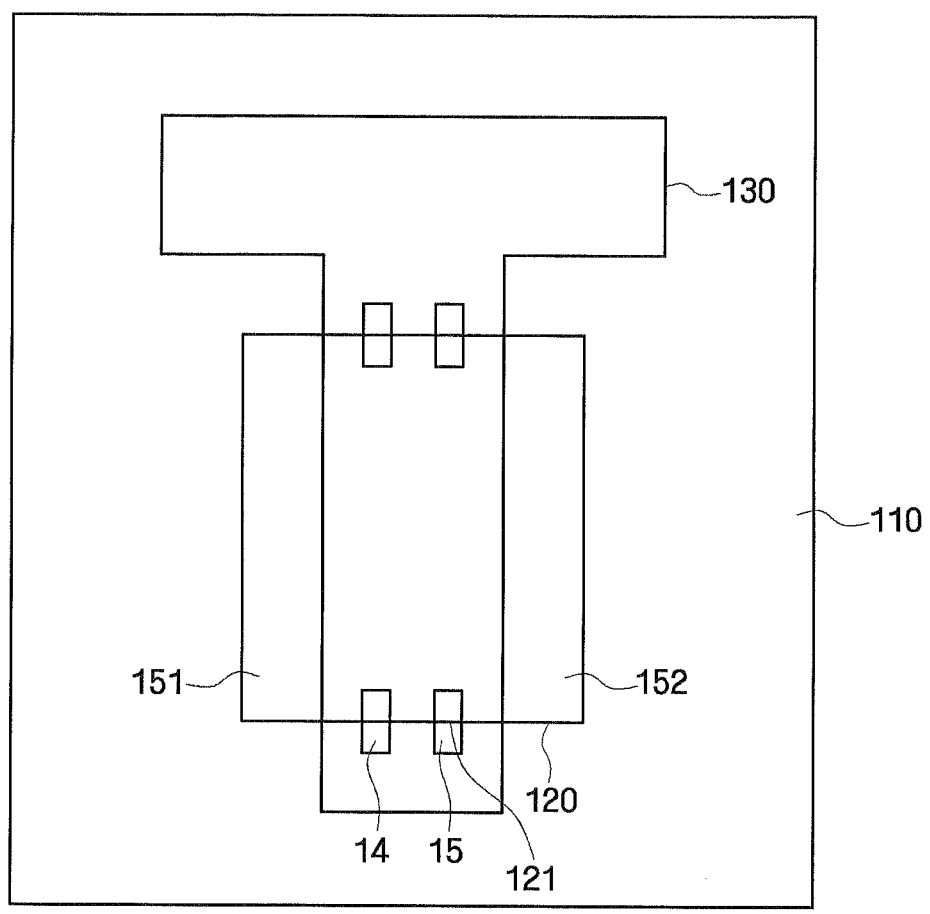
FIG. 24 is a plan view of a semiconductor device according to an embodiment of the present inventive concept.

FIG. 24 is a plan view of a semiconductor device according to an embodiment of the present inventive concept.

Referring to FIG. 24, the semiconductor device fabricated by a method according to an embodiment of the present inventive concept includes a plurality of channel formation preventing portions 14 and 15. The fabricating method according to an embodiment of the present inventive concept is substantially the same as that according to the embodiment of the present inventive concept described in connection with FIGS. 6-22, except that the plurality of channel formation preventing portions 14 and 15 are formed in a gate electrode 130 to overlap an edge portion 121 of an active region 120, instead of one channel formation preventing portion overlapping an edge portion 121 of an active region 120.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive.

What is claimed is:

1. A method of fabricating a semiconductor device comprising:
    forming an isolation region on a semiconductor substrate;
    defining an active region on the semiconductor substrate;
    forming a gate electrode on the active region and on the isolation region, the gate electrode extending from the isolation region across the active region; and
    forming at least one opening portion in the gate electrode, the opening portion overlapping an edge portion of the active region,
    wherein the opening portion is simultaneously formed with the gate electrode.

2. The method of claim 1, wherein the forming the isolation region comprises:
    forming a trench in the semiconductor substrate; and
    forming an insulation pattern in the trench.

3. The method of claim 2, wherein the insulation pattern includes a dent recessed toward a lower portion of the trench, the dent being adjacent the edge portion.

4. The method of claim 1, further comprising forming a gate insulation layer on the active region and the isolation region under the gate electrode.

5. The method of claim 4, wherein the gate insulation layer has a first thickness at a first portion of the active region and has a second thickness at the edge portion of the active region, the first thickness being greater than the second thickness.

6. The method of claim 1, further comprising forming a spacer at opposite sides of the gate electrode.

7. The method of claim 6, wherein the forming the spacer comprises depositing a spacer pattern in the opening portion.

8. The method of claim 7, further comprising forming source and drain regions by injecting impurities into portions of the active region at the opposite sides of the gate electrode, wherein the portions of the active region receiving the impurities do not overlap the spacer pattern.

9. A method of fabricating a semiconductor device comprising:
    defining an isolation region and an active region by performing a shallow trench isolation (STI) process on a semiconductor substrate;
    forming a gate insulation layer on the isolation region and the active region;
    forming a gate electrode on the gate insulation layer; and
    forming at least one opening portion in the gate electrode, wherein the opening portion overlaps an edge portion of the active region,
    wherein performing the STI process comprises forming a trench in the semiconductor substrate surrounding the active region, and forming an insulation pattern in the trench, and
    wherein the opening portion is simultaneously formed with the gate electrode.

10. The method of claim 9, wherein the insulation pattern includes a dent recessed toward a lower portion of the trench, the dent being adjacent the edge portion.

11. The method of claim 9, wherein the gate insulation layer has a first thickness at a first portion of the active region and a second thickness at an edge portion of the active region, the first thickness being greater than the second thickness.

12. The method of claim 9, further comprising forming a spacer at opposite sides of the gate electrode.

13. The method of claim 12, wherein the forming the spacer comprises depositing a spacer pattern in the opening portion.

14. The method of claim 13, further comprising forming source and drain regions by injecting impurities into portions of the active region at the opposite sides of the gate electrode, wherein the portions of the active region receiving the impurities do not overlap the spacer pattern.

* * * * *